(12) United States Patent
Eldar et al.

(10) Patent No.: US 8,836,557 B2
(45) Date of Patent: Sep. 16, 2014

(54) SUB-NYQUIST SAMPLING OF SHORT PULSES

(75) Inventors: Yonina Eldar, Haifa (IL); Ewa Matusiak, Vienna (AT)

(73) Assignee: Technion Research & Development Foundation Ltd., Haifa (IL)

( * ) Notice: Subject to any disclaimer, the term of this patent is extended or adjusted under 35 U.S.C. 154(b) by 0 days.

(21) Appl. No.: 13/824,369

(22) PCT Filed: Oct. 5, 2011

(86) PCT No.: PCT/IB2011/054384
§ 371 (c)(1),
(2), (4) Date: Mar. 17, 2013

(87) PCT Pub. No.: WO2012/049591
PCT Pub. Date: Apr. 19, 2012

(65) Prior Publication Data
US 2013/0187682 A1 Jul. 25, 2013

Related U.S. Application Data

(60) Provisional application No. 61/392,671, filed on Oct. 13, 2010.

(51) Int. Cl.
*H03M 1/00* (2006.01)
*H03K 5/00* (2006.01)
*H03M 7/30* (2006.01)

(52) U.S. Cl.
CPC .. *H03K 5/00* (2013.01); *H03M 7/30* (2013.01)
USPC ............. 341/122; 327/91; 375/152; 375/343; 341/121

(58) Field of Classification Search
CPC ............ H03M 2201/71; H03M 1/124; H03M 1/1245; H03M 3/494; H03M 3/496
USPC ........................ 341/122; 327/91; 375/152.343
See application file for complete search history.

(56) References Cited

U.S. PATENT DOCUMENTS

| | | | |
|---|---|---|---|
| 5,414,623 A | 5/1995 | Lu et al. | |
| 5,812,605 A | 9/1998 | Smith et al. | |
| 6,018,600 A | 1/2000 | Levin et al. | |
| 6,806,708 B1 | 10/2004 | Lee et al. | |
| 7,280,615 B2 | 10/2007 | Roberts | |
| 7,636,403 B2 * | 12/2009 | Eldar et al. ..................... | 375/343 |
| 7,652,608 B1 | 1/2010 | Mathis et al. | |

(Continued)

OTHER PUBLICATIONS

Lin et al., "Periodically nonuniform sampling of bandpass signals", IEEE Transactions on Circuits & Systems—II: Analog & Digital Signal Processing, vol. 45, No. 3, pp. 340-351, Mar. 1998.

(Continued)

*Primary Examiner* — Lam T Mai
(74) *Attorney, Agent, or Firm* — D. Kligler I.P. Services Ltd.

(57) ABSTRACT

A method for signal processing includes accepting an analog signal, which consists of a sequence of pulses confined to a finite time interval. The analog signal is sampled at a sampling rate that is lower than a Nyquist rate of the analog signal and with samples taken at sample times that are independent of respective pulse shapes of the pulses and respective time positions of the pulses in the time interval. The sampled analog signal is processed.

17 Claims, 6 Drawing Sheets

(56) References Cited

U.S. PATENT DOCUMENTS

| | | | |
|---|---|---|---|
| 7,751,469 B2* | 7/2010 | Eldar et al. | 375/152 |
| 7,888,900 B2* | 2/2011 | Okamoto et al. | 318/568.21 |
| 8,032,085 B2* | 10/2011 | Mishali et al. | 455/59 |
| 8,457,579 B2* | 6/2013 | Mishali et al. | 455/207 |
| 2002/0003843 A1 | 1/2002 | Maritone | |
| 2004/0264634 A1 | 12/2004 | Claus et al. | |
| 2005/0141603 A1 | 6/2005 | Miller | |
| 2005/0179585 A1 | 8/2005 | Walker et al. | |
| 2006/0009225 A1 | 1/2006 | Herre et al. | |
| 2006/0013597 A1 | 1/2006 | Crivelli et al. | |
| 2006/0217082 A1 | 9/2006 | Fischer | |
| 2008/0129560 A1 | 6/2008 | Baraniuk et al. | |
| 2008/0221711 A1 | 9/2008 | Trainer | |
| 2009/0190689 A1 | 7/2009 | Blu et al. | |
| 2010/0010351 A1 | 1/2010 | Jovanovic et al. | |
| 2010/0178057 A1 | 7/2010 | Shieh | |
| 2011/0225218 A1 | 9/2011 | Eldar et al. | |
| 2012/0068867 A1 | 3/2012 | Pagnanelli | |
| 2013/0038479 A1 | 2/2013 | Eldar et al. | |

OTHER PUBLICATIONS

Tian et al., "Compressed sensing for wideband cognitive radios", IEEE Conference on Acoustics, Speech & Signal Processing, vol. 4, pp. IV1357-IV1360, Honolulu, USA, Apr. 15-20, 2007.

Davis et al., "Adaptive Greedy Approximations", Journal on Constructive Approximation, vol. 13, No. 1, pp. 57-98, year 1997.

Candes et al., "Decoding by Linear Programming", IEEE Transactions on Information Theory, vol. 51, No. 12, pp. 4203-4215, Dec. 2005.

Kruskal, J.B., "Three-way Arrays: rank and uniqueness of trilinear decompositions, with application to arithmetic complexity and statistics", Linear Algebra and its Applications, vol. 18, issue 2, pp. 95-138, year 1977.

Mondillo et al., "Handheld echocardiography: its use and usefulness", International Journal of cardiology, vol. 111, No. 1, pp. 1-5, year 2006.

Tropp et al., "Random Filters for Compressive Sampling and Reconstruction", IEEE International Conference on Acoustics, Speech and Signal Processing, pp. III872-III875, Toulouse, France, May 2006.

Unser et al., "A General Sampling Theory for Nonideal Acquisition Devices", IEEE Transactions on Signal Processing, vol. 42, No. 11, pp. 2915-2925, Nov. 1994.

Aldroubi et al., "Nonuniform Sampling and Reconstruction in Shift-Invariant Spaces", SIAM Journal, vol. 43, issue 4, pp. 585-620, Mar. 2001.

Eldar et al., "Nonideal Sampling and Interpolation From Noisy Observations in Shift-Invariant Spaces", IEEE Transactions on Signal Processing, vol. 54, No. 7, pp. 2636-2651, Jul. 2006.

Hou et al., "A new method for high resolution estimation of time delay", IEEE International Conference on Acoustics, Speech and Signal Processing, vol. 7, pp. 420-423, May 1982.

Senior et al., "Portable echocardiography: a review", British Journal of cardiology, vol. 13, No. 3, pp. 185-189, May/Jun. 2006.

Bienvenu et al., "Adaptivity to background noise spatial coherence for high resolution passive methods", IEEE International Conferences on Acoustics, Speech and Signal Processing, vol. 5, pp. 307-310, Apr. 1980.

Unser, M., "Splines: A Perfect Fit for Signal and Image Processing", IEEE Signal Processing Magazine, vol. 16, No. 6, pp. 22-38, Nov. 1999.

Unser et al., "Cardinal Exponential Splines: Part I—Theory and Filtering Algorithms", IEEE Transactions on Signal Processing, vol. 53, No. 4, pp. 1425-1438, Apr. 2005.

Maravic et al., "Sampling and reconstructions of signals with finite rate of innovation in the presence of noise", IEEE Transactions on Signal Processing, vol. 53, No. 8, pp. 2788-2805, Aug. 2005.

Kusuma et al., "Multichannel Sampling of Parametric Signals with a Successive Approximation Property", IEEE International Conference in Image Processing, pp. 1265-1268, Oct. 2006.

Shan et al., "On Spatial Smoothing for direction-of-arrival estimation of coherent signals", IEEE Transactions on Acoustics, Speech and Signal Processing, vol. 33, No. 4, pp. 806-811, Aug. 1985.

Bresler et al., "Spectrum-blind minimum rate sampling and reconstruction of 2-D multi-band signals", IEEE International Conference on Image Processing, vol. 1, pp. 701-704, Switzerland, Sep. 1996.

Benedetto et al., "Gabor Systems and the balian-low theorem", Gabor Analysis and Algorithms: Theory and Applications, pp. 85-122, year 1998.

Feichtinger et al., "A Banach space of test functions for gabor analysis", Gabor Analysis and Algorithms: Theory and Applications, p. 123-170, year 1998.

Daubechies et al., "Painless nonorthogonal expansions", Journal of Mathematical Physics, vol. 27, No. 5, pp. 1271-1283, May 1986.

Christensen et al., "Pairs of dual gabor frame generators with compact support and desired frequency localization", Applied and Computational Harmonic Analysis, vol. 20, No. 3, pp. 403-410, May 2006.

Candes et al., "Near Optimal Signal Recovery from random projections: universal encoding strategies?", IEEE information Theory, vol. 52, No. 12, pp. 5406-5425, Dec. 2006.

Rudelson et al., "On Sparse Reconstruction from Fourier and Gaussian Measurements", Communications on Pure and Applied Mathematics, vol. 61, issue 8, pp. 1025-1045, year 2008.

Ron et al., "Frames and stable bases for shift-invariant subspaces of L2(Rd)", Canadian Journal of Mathematics, vol. 47, No. 5, pp. 1051-1094, year 1995.

Prete, V.D., "Estimates, decay properties, and computation of the dual function for gabor frames", Journal of Fourier Analysis and Applications, vol. 5, issue 6, pp. 545-562, year 1999.

Grochenig et al., "Note on b-slines, wavelet scaling functions, and gabor games", IEEE Transactions on Information Theory, vol. 49, No. 12, pp. 3318-3320, Dec. 2003.

Folland et al., "The uncertainty principle: a mathematical survey", Journal of Fourier Analysis and Applications, vol. 3, No. 3, pp. 207-238, year 1997.

Butzer et al., "A sampling theorem for duration-limited functions with error estimates", Information and Control, vol. 34, issue 1, pp. 55-65, May 1977.

Butzer et al., "Sampling theory for not necessarily band-limited functions: A historical overview", SIAM review, vol. 34, No. 1, pp. 40-53, Mar. 1992.

Grochenig, K., "Foundations of Time-Frequency Analysis", chapter 3.1 (pp. 36-41) and chapter 5.2 (pp. 92-97, year 2001.

Dragotti et al., "Sampling moments and reconstructing signals of finite rate of innovation: Shannon meets strangfix", IEEE Transactions on Signal Processing, vol. 55, No. 5, pp. 1741-1757, May 2007.

Hua et al., "Matrix pencil method for estimating parameters of exponentially damped/undamped sinusoids in noise", IEEE Transactions on Acoustics, Speech and Signal Processing, vol. 38, No. 5, pp. 814-824, May 1990.

Kumaresan et al., "Estimating the angles of arrival of multiple plane waves", IEEE Transactions on Aerospace Electronic System, vol. AES19, No. 1, pp. 134-139, Jan. 1983.

Roy et al., "ESPRIT—estimation of signal parameters via rotational invariance techniques", IEEE Transactions on Acoustics, Speech and Signal Processing, vol. 37, No. 7, pp. 984-995, Jul. 1989.

Schmidt, E., "Multiple emitter location and signal parameter estimation", IEEE Transactions on Antennas & Propagation, vol. AP-34, No. 3, pp. 276-280, Mar. 1986.

International Application PCT/IB2010/050661 Search Report dated Jul. 15, 2010.

U.S. Appl. No. 13/144,086 Office Action dated Nov. 28, 2012.

Chen et al., "Modulated Wideband Converter with Non-Ideal Lowpass Filters", 2010 IEEE International Conference on Acoustics Speech and Signal Processing (ICASSP), pp. 3630-3633, Dallas, USA, Mar. 14-19, 2010.

EP Application # 11156901.8 Extended Search Report dated Jul. 6, 2011.

Mishali et al., "Spectrum-blind reconstruction of multi-band signals", IEEE International Conference on Acoustics, Speech and Signal Processing, pp. 3365-3368, Las Vegas, USA, Mar. 31-Apr. 4, 2008.

(56) References Cited

OTHER PUBLICATIONS

"Cascaded 2-Tone, 3rd-Order Compression Point (IP3)", RF Cafe Website, downloaded from http://www.rfcafe.com/references/electrical/ip3.htm on Apr. 19, 2010.
Mishali et al., "Reduce and Boost: Recovering Arbitrary Sets of Jointly Sparse Vectors", IEEE Transactions on Signal Processing, vol. 56, No. 10, pp. 4692-4702, Oct. 2008.
Mishali et al., "Xampling—Part I: Practice", arXiv:0911.0519v1, Nov. 3, 2009.
Mishali et al., "The modulated wideband converter: online documentation and simulations", Jul. 10, 2009 (http://webee.technion.ac.il/Sites/People/YoninaEldar/Info/software/GUI/MWC_GUI.htm).
Calderbank et al., "Compressed Learning: Universal Sparse Dimensionality Reduction and Learning in the Measurement Domain", Feb. 13, 2009.
Candes, E. J., "The Restricted Isometry Property and Its Implications for Compressed Sensing", Feb. 27, 2008.
El-Chammas et al., "General Analysis on the Impact of Phase-Skew in Time-Interleaved ADCs", IEEE Transactions on Circuits and Systems—I: Regular papers, vol. 56, No. 5, pp. 902-910, May 2009.
National Semiconductor Corporation, "A/D Converter—Definition of terms", Jan. 2000.
Tropp, J.A., "Algorithms for simultaneous spare approximation. Part II: Convex relaxation", Special Issue on Sparse Approximations in Signal and Image Processing, vol. 86, issue 3, pp. 589-602, Mar. 2006.
"Wireless LAN Medium Access Control (MAC) and Physical Layer (PHY) specifications: High-speed physical layer in the 5 GHz band," IEEE Standard 802.11a, year 1999.
Zverev, A.I. "Handbook of Filter Synthesis", p. 13, John Wily & Sons 1967.
Viterbi, A.J., "CDMA principles of spread spectrum communication," Addison-Wesly Wireless Communications Series, 1995.
Kohlenberg, A., "Exact interpolation of band-limited functions", Journal of Applied Physics, vol. 24, No. 12, pp. 1432-1435, Dec. 1953.
Dickson et al., "An 80-Gb/s 231—1 pseudorandom binary sequence generator in SiGe BiCMOS technology", IEEE Journal on Solid-State Circuits, vol. 40, No. 12, pp. 2735-2745, Dec. 2005.
Razavi, B., "A 60-GHz CMOS receiver front-end", IEEE Journal of Solid-State Circuits, vol. 41, No. 1, pp. 17-22, Jan. 2006.
Shannon, C.E., "Communication in the presence of noise", Proceeding of IRE, vol. 86, No. 2, pp. 447-457, Feb. 1998 (reprinted from Ire proceedings vol. 37, pp. 10-21, 1949).
Hedge et al., "Random projections for manifold learning", Advances in Neural Information Processing Systems 20, pp. 641-648, year 2008.
Herley et al., "Minimum rate sampling and reconstruction of signals with arbitrary frequency support", IEEE Transactions on Information Theory, vol. 45, No. 5, pp. 1555-1564, Jul. 1999.
Kienmayer et al., "A low-power low-voltage NMOS bulk-mixer with 20 GHz bandwidth in 90 nm CMOS", Proceedings of the 2004 International Symposium on Circuits and Systems, vol. 4, Vancouver, Canada, May 23-26, 2004.
Wang et al., "A background timing-skew calibration technique for time-interleaved analog-to-digital converters", IEEE Transactions on Circuits & Systems—II: Express Briefs, vol. 53, No. 4, pp. 299-303, Apr. 2006.
Donoho et al., "Optimally sparse representation in general (nonorthogonal) dictionaries via I1 minimization", Proceedings of the National Academy of Science of USA, vol. 100, No. 4, pp. 2197-2202, Mar. 4, 2003.
Donoho, D.L., "Compressed sensing", IEEE Transactions on Information Theory, vol. 52, issue 4, pp. 1289-1306, Apr. 2006.
Candes et al., "Robust uncertainty principles: Exact signal reconstruction from highly incomplete frequency information", IEEE Transactions on Information Theory, vol. 52, No. 2, pp. 489-509, Feb. 2006.
Laskin et al., "A 60 mW per Lane, 4 x 23-Gb/s 27 -1 PRBS Generator", IEEE Journal on Solid-State Circuits, vol. 41, No. 10, pp. 2198-2208, Oct. 2006.
Gardner, F., "Properties of frequency difference detectors", IEEE Transactions on Communications, vol. 33, No. 2, pp. 131-138, Feb. 1985.
Landau, H.J., "Necessary density conditions for sampling and interpolation of certain entire functions", Acta Mathematica, vol. 177, No. 1, pp. 37-52, Feb. 1967.
Johansson et al., "Reconstruction of nonuniformly sampled bandlimited signals by means of digital fractional delay filters", IEEE Transactions on Signal Processing, vol. 50, No. 11, pp. 2757-2767, Nov. 2002.
Nyquist, H., "Certain Topics in Telegraph Transmission Theory", Proceedings of the IEEE, vol. 90, No. 2, pp. 280-305, Feb. 2002 (reprinted from Transactions of A.I.E.E, vol. 47, No. 2, pp. 617-644, Apr. 1928).
Friis, H. T., "Noise figures of radio receivers", Proceedings of the IRE, vol. 32, No. 7, pp. 419-422, Jul. 1944.
Tropp, J. A., "Algorithms for simultaneous spare approximation. Part I: Greedy pursuit", Special Issue on Sparse Approximations in Signal and Image Processing, vol. 86, pp. 572-588, Apr. 2006.
Chen et al., "Theoretical results on sparse representations of multiple-measurement vectors", IEEE Transactions on Signal Processing, vol. 54, No. 12, pp. 4634-4643, Dec. 2006.
Crols et al., "Low-IF topologies for high-performance analog front ends of fully integrated receivers", IEEE Transactions on Circuits & Systems—I: Analog and Digital Signal Processing, vol. 45, No. 3, pp. 269-282, Mar. 1998.
Elbornsson et al., "Blind equalization of time errors in a time-interleaved ADC system", IEEE Transactions on Signal Processing, vol. 53, No. 4, pp. 1413-1424, Apr. 2005.
Laska et al., "Theory and implementation of an analog-to-information converter using random demodulation", IEEE Proceedings of International Symposium on Circuits and Systems, pp. 1959-1962, New Orleans, USA, May 27-30, 2007.
Le et al., "Analog-to-digital converters", IEEE Signal Processing Magazine, vol. 22, No. 6, pp. 69-77, Nov. 2005.
Cotter et al., "Sparse solutions to linear inverse problems with multiple measurement vectors", IEEE Transactions on Signal Processing, vol. 53, No. 7, pp. 2477-2488, Jul. 2005.
Venkataramani et al., "Perfect reconstruction formulas and bounds on aliasing error in sub-Nyquist nonuniform sampling of multiband signals", IEEE Transactions on Information Theory, vol. 46, No. 6, pp. 2173-2183, Sep. 2000.
Unser, M., "Sampling—50 years after Shannon", Proceedings of the IEEE, vol. 88, No. 4, pp. 569-587, Apr. 2000.
Vetterli et al., "Sampling signals with finite rate of innovation", IEEE Transactions on Signal Processing, vol. 50, No. 6, pp. 1417-1428, Jun. 2002.
Mitoja, J., "Cognitive radio for flexible mobile multimedia communications", Mobile Networks and Applications, vol. 6, issue 5, pp. 435-441, Sep. 2001.
Alon et al., "Simple constructions of almost k-wise independent random variables", Proceedings of the 31st Annual Symposium on Foundations of Computer Science, vol. 2, pp. 554-553, St. Louis, USA, Oct. 22-24, 1990.
Carvalho et al., "Compact formulas to relate ACPR and NPR to two-tone IMR and IP3", Microwave Journal, vol. 42, No. 12, Dec. 1999.
Boutin et al., "An arctangent type wideband PM/FM demodulator with improved performances", Proceedings of the 33rd Midwest Symposium on Circuits and Systems, pp. 460-463, Calgary, Canada, Aug. 12-14, 1990.
Feng et al., "Spectrum-blind minimum-rate sampling and reconstruction of multiband signals", Proceedings of IEEE International Conference on ASSP, vol. 2, pp. 1688-1691, May 1996.
Vaidyanathan et al., "Generalizations of the sampling theorem: Seven decades after Nyquist", IEEE Transactions on Circuits & Systems—I: Fundamental Theory and Applications, vol. 48, No. 9, pp. 1094-1109, Sep. 2001.
Welch et al., "The use of fast Fourier transform for the estimation of power spectra: A method based on time averaging over short, modi-

(56) References Cited

OTHER PUBLICATIONS fied periodograms", IEEE Transactions on Audio and Electroacoustics, vol. 15, No. 2, pp. 70-73, Jun. 1967.

Baraniuk et al., "A simple proof of the restricted isometry property for random matrices," Constructive Approximation, Feb. 5, 2007.

Chen et al., "Atomic decomposition by basis pursuit", SIAM Review, vol. 43, No. 1, pp. 129-159, year 2001 (published originally in SIAM Journal on Scientific Computing, vol. 20, No. 1, pp. 33-61, Aug. 1998).

Huang et al., "Blind calibration of timing offsets for four-channel time-interleaved ADCs", IEEE Transactions on Circuits & Systems—I: Regular papers, vol. 54, No. 4, pp. 863-876, Apr. 2007.

Vaughan et al., "The theory of Bandpass Sampling", IEEE Transactions on Signal Processing, vol. 39, No. 9, pp. 1973-1984, Sep. 1991.

Walden, R.H., "Analog-to-digital converter survey and analysis", IEEE Journal on Selected Areas in Communication, vol. 17, No. 4, pp. 539-550, Apr. 1999.

Pickoltz et al., "Theory of Spread-Spectrum Communications—A Tutorial", IEEE Transactions on Communications, vol. 30, No. 5, pp. 855-884, May 1982.

Kotelnikov, V.A., "On the transmission capacity of 'ether' and wire in electrocommunications", Proceedings of the first All-Union Conference on the technological reconstruction of the communications sector and the development of low-current engineering, Moscow, Russia, 1933.

Black et al., "Time interleaved converter arrays", IEEE International Conference on Solid-State Circuits, vol. XXIII, pp. 14-15 & 254, Feb. 13, 1980.

Eldar et al., "Filter bank reconstruction of bandlimited signals from nonuniform and generalized samples," IEEE Transactions on Signal Processing, vol. 48, No. 10, pp. 2864-2875, Oct. 2000.

Eldar et al., "A minimum squared-error framework for generalized sampling", IEEE Transactions on Signal Processing, vol. 54, No. 6, pp. 2155-2167, Jun. 2006.

Jeng, Y.C., "Digital spectra of nonuniformly sampled signals: a robust sampling time offset estimation algorithm for ultra high-speed waveform digitizers using interleaving", IEEE Transactions on Instrumentation & Measurement, vol. 39, No. 1, pp. 71-75, Feb. 1990.

Chen et al., "A Sub-Nyquist Rate Sampling Receiver Exploiting Compressive Sensing", IEEE Transactions on Circuits and Systems—I: Regular papers, vol. 58, No. 3, pp. 507-520, Mar. 2011.

European Application # 08808014.8 Examination Report dated Apr. 19, 2010, 17 pages.

Venkataramani et al., "Further results on spectrum blind sampling of 2D signals", Proceedings of the 1998 International Conference on Image Processing (ICIP), vol. 2, pp. 752-756, Oct. 4, 1998.

Rauhut et al., "Average Case Analysis of Multichannel Basis Pursuit", 8th international conference on Sampling Theory and Applications, Marseille, France, May 18-22, 2009.

Eldar et al., "Robust Recovery of Signals From a Structured Union of Subspaces", IEEE Transactions on Information Theory, vol. 55, issue 11, pp. 5302-5316, Nov. 2009.

Fleyer et al., "Multirate Synchronous Sampling of Sparse Multiband Signals", arXiv:0806.0579v1 [cs.IT], Jun. 3, 2008.

Fudge et al., "A Nyquist Folding Analog-to Information Receiver", 42nd Asilomar Conference on Signals, Systems and Computers, pp. 541-545, Pacific Grove, USA, Oct. 26-29, 2008.

Gedalyahu et al., "Low Rate Sampling Schemes for Time Delay Estimation", arXiv:0905.2429v1 [cs.IT], May 14, 2009.

Gentile, K., "Introduction to Zero-Delay Clock Timing Techniques", Analog Device Application Note AN-0983, Rev.0, year 2008.

Li et al., "Quickest Spectrum Sensing in Cognitive Radio", 42nd Annual Conference on Information Sciences and Systems, pp. 203-208, Princeton, USA, Mar. 19-21, 2008.

Lu et al., "A Theory for Sampling Signals from a Union of Subspaces", IEEE Transactions on Signal Processing, vol. 56, issue 6, pp. 2334-2345, Jun. 2008.

Maxim Integrated Products, "Data Converters", year 2008.

Mini-Circuits, "Understanding VCO Concepts", Application Note AN-95-007, Revision , Aug. 21, 2009.

Mishali et al., "Blind Multiband Signal Reconstruction: Compressed Sensing for Analog Signals", IEEE Transactions on Signal Processing, vol. 57, No. 3, pp. 993-1009, Mar. 2009.

Mishali et al., "Expected RIP: Conditioning of the Modulated Wideband Converter", IEEE Information Theory Workshop, pp. 343-347, Taormina, Italy, Oct. 11-16, 2009.

Mishali et al., "From Theory to Practice: Sub-Nyquist Sampling of Sparse Wideband Analog Signals", arXiv:0902.4291v3 [cs.IT], Feb. 25, 2009.

Polo et al., "Compressive Wide-Band Spectrum Sensing", IEEE International Conference on Acoustics, Speech and Signal Processing, pp. 2337-2340, Taipei, Taiwan, Apr. 19-24, 2009.

Polo, Y.L., "Compressive Wideband Spectrum Sensing for Cognitive Radio Applications", Master of Science Thesis, Delft University of Technology, Nov. 28, 2008.

Ragheb et al., "A Prototype Hardware for Random Demodulation Based Compressive Analog-to-Digital Conversion", 51st Midwest Symposium on Circuits and Systems, pp. 37-40, Knoxville, USA, Aug. 10-13, 2008.

Texas Instruments Incorporated, "Data Converters", years 1995-2010.

Tropp et al., "Beyond Nyquist: Efficient Sampling of Sparse Bandlimited Signals", arXiv:0902.0026v2 [cs.IT], Jan. 31, 2009.

Tsai et al., "Correction of Mismatches in a Time-Interleaved Analog-to-Digital Converter in an Adaptively Equalized Digital Communication Receiver", IEEE Transactions on Circuits and Systems—I: Regular Papers, vol. 56, No. 2, pp. 307-319, Feb. 2009.

Wakin, M.B., "A Manifold Lifting Algorithm for Multi-View Compressive Imaging", Picture Coding Symposium, pp. 1-4, Chicago, USA, May 6-8, 2009.

Eldar et al., "Beyond Bandlimited Sampling", IEEE Signal Processing Magazine, vol. 26, issue 3, pp. 48-68, May 2009.

Eldar, Y., "Compressed Sensing of Analog Signals in Shift-Invariant Spaces", IEEE Transactions on Signal Processing, vol. 57, No. 8, pp. 2986-2997, Aug. 2009.

Eldar, Y., "Uncertainty Relations for Shift-Invariant Analog Signals", IEEE Transactions on Signal Processing, vol. 55, No. 12, pp. 5742-5757, Dec. 2009.

Yu et al., "Mixed-Signal Parallel Compressed Sensing and Reception for Cognitive Radio", IEEE International Conference on Acoustics, Speech and Signal Processing, pp. 3861-3864, Las Vegas, USA, Mar. 31-Apr. 4, 2008.

Zhang et al., "Compressive Sensing Based Ultra-wideband Communication System", IEEE International Conference on Communications, pp. 1-5, Dresden, Germany, Jun. 14-18, 2009.

Camarero et al., "Mixed Signal Clock-Skew Calibrator for Time Interleaved Analog-to-Digital Converters", IEEE Transactions on Circuits and Systems—I: Regular papers, vol. 55, No. 11, pp. 3676-3687, Dec. 2008.

Mendelson et al., "Uniform Uncertainty Principle for Bernouilli and Subgaussian Ensembles", arXiv:math/0608665v1, Aug. 27, 2006.

Laugesen, R.S., "Gabor Dual Spline Windows", Jun. 23, 2008.

Christensen et al., "Gabor windows supported on [-1,1] and compactly supported dual windows", BK21 Research Report, Jun. 24, 2009.

Prete, V., "On a Necessary Condition for B-Spline Gabor Frames", Ricerche di matematica, vol. 59, No. 1, pp. 161-164, Mar. 12, 2010.

Michaeli et al., "Optimization techniques in modern sampling theory", Convex Optimization in Signal Processing and Communications, Cambridge University Press, Mar. 16, 2009.

Ramani et al., "Nonideal Sampling and Regularization Theory", IEEE Transactions on Signal Processing, vol. 56, No. 3, pp. 1055-1070, Mar. 2008.

Blu et al., "Sparse sampling of signal innovations", IEEE Signal Processing Magazine, vol. 25, No. 2, pp. 31-40, Mar. 2008.

Tur et al., "Low Rate Sampling of Pulse Streams with Application to Ultrasound Imaging", arXiv:1003.2822v3 [cs.IT], Mar. 14, 2010.

Matusiak et al., "Sub-Nyquist Sampling of Short Pulses: Part I", arXiv:1010.3132v1 [cs.IT], Oct. 15, 2010.

(56) References Cited

OTHER PUBLICATIONS

Akhoundi Asl et al., "Multichannel Sampling of Signals with Finite Rate of Innovation", IEEE Signal Processing Letters, vol. 17, No. 8, pp. 762-765, Aug. 2010.

Seelamantula et al., "A Generalized Sampling Method for Finite-Rate-of-Innovation-Signal Reconstruction", IEEE Signal Processing Letters, vol. 15, pp. 813-816, year 2008.

Olkkonen et al., "Measurement and Reconstruction of Impulse Train by Parallel Exponential Filters", IEEE Signal Processing Letters, vol. 15, pp. 241-244, year 2008.

Gedalyahu et al., "Time-Delay Estimation From Low-Rate Samples: A Union of Subspaces Approach", IEEE Transactions on Signal Processing, vol. 58, No. 6, pp. 3017-3031, Jun. 2010.

Mishali et al., "Xampling: Signal Acquisition and Processing in Union of Subspaces", arXiv:0911.0519v2 [cs.IT], Sep. 25, 2010.

Mishali et al., "Xampling: analog to digital at sub-Nyquist rates", arXiv:0912.2495v1, Dec. 13, 2009.

Bajwa et al., "Identification of Underspread Linear Systems with Application to Super-Resolution Radar", arXiv:1008.0851v1 [cs.IT], Aug. 4, 2010.

Eldar et al., "Recovering Signals From Lowpass Data", arXiv:0907.3576v1, Jul. 21, 2009.

International Application PCT/IB2011/051449 Search Report dated Nov. 14, 2011.

International Application PCT/IB2011/054384 Search Report dated Feb. 17, 2012.

Candes et al., "Compressed Sensing with Coherent and Redundant Dictionaries", May 14, 2010.

Mishali et al., "From Theory to Practice: Sub-Nyquist Sampling of Sparse Wideband Analog Signals", IEEE Journal of Selected Topics in Signal Processing, vol. 4, No. 2, pp. 375-391, Apr. 2010.

Smith et al., "Compressed Sampling for Pulse Doppler Radar", IEEE Radar Conference, pp. 887-892, May 10, 2010.

Pfander et al., "Sparsity in Time Frequency Representations", Journal of Fourier Analysis and Applications, vol. 16, No. 2, pp. 233-260, Aug. 4, 2009.

Matusiak et al., "Sub-Nyquist Sampling of Short Pulses: Theory", Apr. 11, 2011.

U.S. Appl. No. 13/041,455 Office Action dated Jan. 15, 2014.

U.S. Appl. No. 13/041,455 Office Action dated May 23, 2014.

Smith, "Digital Audio Resampling Home Page", Stanford University, Center for Computer Research in Music and Acoustics, pp. 1-19, 2005.

\* cited by examiner

SUB-NYQUIST SAMPLING OF SHORT PULSES

CROSS-REFERENCE TO RELATED APPLICATIONS

This application claims the benefit of U.S. Provisional Patent Application 61/392,671, filed Oct. 13, 2010, whose disclosure is incorporated herein by reference.

FIELD OF THE INVENTION

The present invention relates generally to signal processing, and particularly to methods and systems for sampling of pulse signals.

BACKGROUND OF THE INVENTION

Several techniques for sampling a signal below the signal's Nyquist rate are known in the art. Such techniques are commonly known as sub-Nyquist sampling techniques. Example sub-Nyquist sampling schemes are described by Vettereli et al., in "Sampling Signals with Finite Rate of Innovation," IEEE Transactions on Signal Processing, volume 50, no. 6, 2002, by Tur et al., in "Low Rate Sampling of Pulse Streams with Application to Ultrasound Imaging," arXiv e-Print archive, March, 2010, and by Gedalyahu et al., in "Multichannel Sampling of Pulse Streams at the Rate of Innovation," arXiv e-Print archive, April, 2010, which are incorporated herein by reference.

Sampling techniques for time-limited signals are described, for example, by Butzer and Splettstosser, in "A Sampling Theorem for Duration-Limited Functions with Error Estimates," Information and Control, volume 34, 1977, and by Butzer and Stens, in "Sampling Theory for Not Necessarily Band-Limited Functions: A Historical Overview," SIAM Review, volume 34, no. 1, 1992, which are incorporated herein by reference.

Some sampling schemes achieve sub-Nyquist sampling rates by exploiting sparsity properties of the sampled signal. Sampling techniques for sparse signals are described, for example, by Mishali and Eldar, in "From Theory to Practice: Sub-Nyquist Sampling of Sparse Wideband Analog Signals," IEEE Journal of Selected Topics in Signal Processing, volume 4, no. 1, 2010, and by Mishali et al., in "Xampling: Analog to Digital at Sub-Nyquist Rates," CIT Report, volume 5751, 2010, which are incorporated herein by reference, and in PCT International Publications WO 2009/034568 and WO 2010/095083, whose disclosures are incorporated herein by reference.

Sampling schemes for short discrete pulses are described by Candes et al., in "Compressed Sensing with Coherent and Redundant Dictionaries," arXiv e-Print archive, May, 2010, which is incorporated herein by reference.

The description above is presented as a general overview of related art in this field and should not be construed as an admission that any of the information it contains constitutes prior art against the present patent application.

SUMMARY OF THE INVENTION

An embodiment of the present invention that is described herein provides a method for signal processing, including:

accepting an analog signal, which consists of a sequence of pulses confined to a finite time interval;

sampling the analog signal at a sampling rate that is lower than a Nyquist rate of the analog signal and with samples taken at sample times that are independent of respective pulse shapes of the pulses and respective time positions of the pulses in the time interval; and processing the sampled analog signal.

In some embodiments, sampling the analog signal includes computing sampled values based on Gabor coefficients with respect to a predefined windowing function. In a disclosed embodiment, the sampled values include Gabor coefficients of the analog signal, linear combinations of the Gabor coefficients of the analog signal, or Gabor coefficients of linear combinations of the analog signal.

In an embodiment, sampling the analog signal includes generating a plurality of weighted superpositions of multiple sub-sections of the analog signal that are drawn from respective sub-intervals of the finite time interval and windowed by a predefined windowing function, and sampling the analog signal using the weighted superpositions. In a disclosed embodiment, sampling the analog signal includes integrating each weighted superposition over the finite time interval to produce a respective sampled value. In another embodiment, sampling the analog signal includes filtering each weighted superposition to produce a respective sampled value.

In some embodiments, sampling the analog signal includes modulating multiple replicas of the analog signal with respective different modulating waveforms, which depend on a predefined windowing function. In an embodiment, each modulating waveform includes a respective sinusoidal signal multiplied by a respective weighted sum of time shifts of the windowing function. In another embodiment, each modulating waveform includes a respective first weighted sum of sinusoidal signals, multiplied by a respective second weighted sum of time shifts of the windowing function.

In some embodiments, the analog signal is sparse in time. In a disclosed embodiment, processing the sampled analog signal includes reconstructing the analog signal based on the sampled analog signal. In another embodiment, the analog signal originates from an ultrasound signal, a radar signal, a communication signal, a bio-imaging signal or a neuronal signal. In some embodiments, the analog signal is sparse in both time and frequency, and sampling the analog signal includes setting the sampling rate responsively to time and frequency sparsity of the signal.

There is additionally provided, in accordance with an embodiment of the present invention, a signal processing apparatus, including:

an input interface, which is configured to accept an analog signal consisting of a sequence of pulses confined to a finite time interval; and a sampling unit, which is configured to sample the analog signal at a sampling rate that is lower than a Nyquist rate of the analog signal and with samples taken at sample times that are independent of respective pulse shapes of the pulses and respective time positions of the pulses in the time interval.

There is also provided, in accordance with an embodiment of the present invention, a method for signal processing, including:

accepting an analog signal that is confined to a finite time interval;

sampling the analog signal by generating multiple sampled values, each sampled value including a respective linear combination of Gabor coefficients of the analog signal with respect to a predefined windowing function; and processing the sampled values.

In some embodiments, generating the sampled values includes generating a plurality of weighted superpositions of multiple sub-sections of the analog signal that are drawn from respective sub-intervals of the finite time interval and windowed by the predefined windowing function, and sampling the analog signal using the weighted superpositions. In an embodiment, generating the sampled values includes integrating each weighted superposition over the finite time interval to produce a respective sampled value. Generating the sampled values may include filtering each weighted superposition to produce a respective sampled value.

There is further provided, in accordance with an embodiment of the present invention, a signal processing apparatus, including:

an input interface, which is configured to accept an analog signal that is confined to a finite time interval; and a sampling unit, which is configured to sample the analog signal by generating multiple sampled values, each sampled value including a respective linear combination of Gabor coefficients of the analog signal with respect to a predefined windowing function.

The present invention will be more fully understood from the following detailed description of the embodiments thereof, taken together with the drawings in which:

DETAILED DESCRIPTION OF EMBODIMENTS

Overview

Embodiments of the present invention that are described herein provide methods and systems for sampling and processing finite-duration analog pulsed signals. The disclosed techniques sample and process analog signals, which consist of one or more pulses having unknown pulse shapes and time positions. Sampling of the signal is performed independently of the pulse shapes and time positions of the pulses. Nevertheless, the methods and systems described herein sample such signals at sampling rates that can be considerably below the Nyquist rate of the signal but still allow for highly accurate signal reconstruction.

In some embodiments, a sampling unit samples the signal by computing sampled values that are based on a set of Gabor coefficients with respect to a predefined windowing function. In some embodiments, the sampling unit computes the individual Gabor coefficients. In other embodiments, the sampling unit exploits the sparsity of the signal and achieves a low sampling rate by computing linear combinations of the Gabor coefficients, or Gabor coefficients of linear combinations of the signal.

In an example embodiment, the sampling unit samples the analog signal using multiple sampling channels operating in parallel. In each sampling channel, the analog signal is modulated by a respective modulating waveform, and the modulation product is then integrated over the finite time interval. The modulating waveforms, which are designed based on the Gabor frame, collect different weighted superpositions of sub-sections of the analog signal, drawn from respective sub-intervals of the finite time interval. Integrating the weighted superpositions produces respective sampled values that represent the analog signal and enable accurate signal reconstruction. Several efficient sampling unit configurations and associated modulating waveforms are described herein. In alternative embodiments, linear combinations of the Gabor coefficients are produced in multiple processing channels by filtering instead of integration.

The disclosed techniques can be applied in a variety of applications involving pulsed signals, such as ultrasound imaging, radar, communication, bio-imaging and processing of neuronal signals. The sampling unit configurations described herein can be applied to both sparse and non-sparse signals.

System and Signal Description

Figure 1:
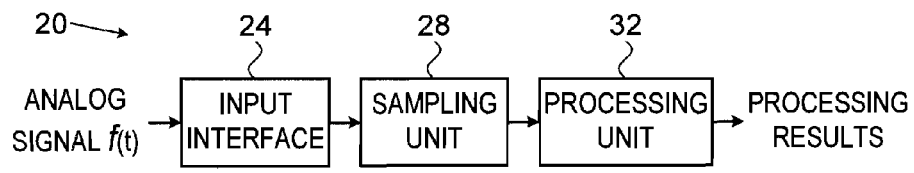
FIG. 1 is a block diagram that schematically illustrates a system for signal sampling and processing, in accordance with an embodiment of the present invention.

FIG. 1 is a block diagram that schematically illustrates a system 20 for signal sampling and processing, in accordance with an embodiment of the present invention. System 20 comprises an input interface 24 for accepting an analog input signal, denoted f(t). A sampling unit 28 samples the signal using methods and hardware configurations that are described in detail below. A processing unit 32 processes the sampled signal, and produces processing results. Systems of this sort can be used in a variety of applications, such as for processing ultrasound signals in ultrasound imaging, processing radar signals, processing communication signals, processing bio-imaging signals, processing neuronal signals, among others.

Figure 2:
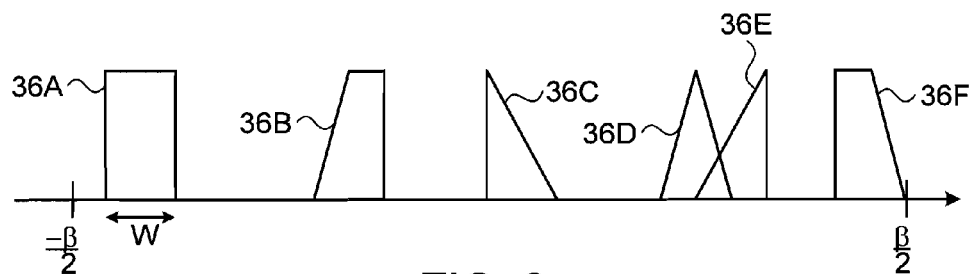
FIG. 2 is a graph showing an analog signal that includes multiple pulses, in accordance with an embodiment of the present invention.

FIG. 2 is a graph showing an analog signal that includes a sequence of pulses, in accordance with an embodiment of the present invention. The analog signal f(t) comprises a superposition of N pulses. In the present example N=6, and the six pulses are denoted 36A . . . 36F. Signal f(t) is confined to a finite time interval $[-\beta/2, \beta/2]$. The maximum pulse width (duration) of any individual pulse is denoted W.

In some embodiments, signal f(t) is sparse, i.e., $N \cdot W \ll \beta$. In other words, f(t) is typically non-zero in only a small portion of time interval $[-\beta/2, \beta/2]$. The embodiments described herein refer to scenarios in which the signal amplitude is zero outside the portion of time occupied by the N pulses. Nevertheless, the disclosed techniques can also be applied successfully in scenarios in which some small residual signal energy remains outside the pulse durations (either inside or outside the time interval in question), e.g., because of noise, energy leakage outside the pulse durations, or for any other reason. (Alternative embodiments in which signal f(t) is not necessarily sparse are addressed further below.)

Generally, each of the pulses making up signal f(t) may be of a different pulse shape and time position within the time interval. One or more of the pulses may overlap. The example of FIG. 1 shows a particular signal comprising a particular constellation of pulses, for the sake of clarity. Generally, however, signal f(t) may comprise one or more pulses having any desired shapes and time positions. The pulse shapes and time positions of the pulses in f(t) are assumed to be unknown. Since signal f(t) has a finite duration, its spectrum is not perfectly band-limited. In practice, however, the majority of the signal's spectral content (e.g., 95% or 99%) is confined to a finite spectral interval $[-\Omega/2, \Omega/2]$. The signal is therefore referred to as essentially band-limited.

As will be shown and demonstrated in detail below, sampling unit 28 of system 20 samples analog signal f(t) at a sampling rate that is lower than the Nyquist rate of the analog signal, and with samples taken at sample times that are independent of the pulse shapes and time positions of the pulses making up the analog signal.

Gabor-Based Sampling

In some embodiments, sampling unit 28 of system 20 samples the analog signal by effectively computing a matrix of Gabor coefficients, denoted Z. Sampling using Gabor frames and Gabor coefficients is described, for example, by Grochenig, in "Foundations of Time-Frequency Analysis," Birkhauser Boston, first edition, December, 2000, sections 3.1 and 5.2, which is incorporated herein by reference. (In alternative embodiments, sampling unit 28 computes linear combinations of the Gabor coefficients and not the individual coefficients, by exploiting the sparsity of the analog signal. These embodiments, which achieve lower sampling rates, are described further below.)

Matrix Z is a two-dimensional array of Gabor coefficients in time-frequency space. The Gabor coefficients are given by:

$$z_{kl} = \int_{-\beta/2}^{\beta/2} f(t) \cdot \overline{g(t-ak)} \cdot e^{-2\pi i b l t} \, dt \quad [1]$$

wherein g(t) denotes a certain window, e.g., a raised-cosine window or any other suitable window function, a and b are constants that define the temporal and spectral sampling resolution, respectively, and i denotes $\sqrt{-1}$.

Computation of the Gabor coefficient $z_{kl}$ can thus be viewed as multiplying signal f(t) with a window function g(t) that is centered around time a·k, computing the Fourier Transform (FT) of the windowed signal, and taking the value of the FT at frequency ω=b·l. In other words, the Gabor coefficient $z_{kl}$ comprises a sample of the Short-Time Fourier Transform (STFT) of signal f(t) using window g(t), evaluated at time t=a·k and frequency ω=b·l.

Figure 3:
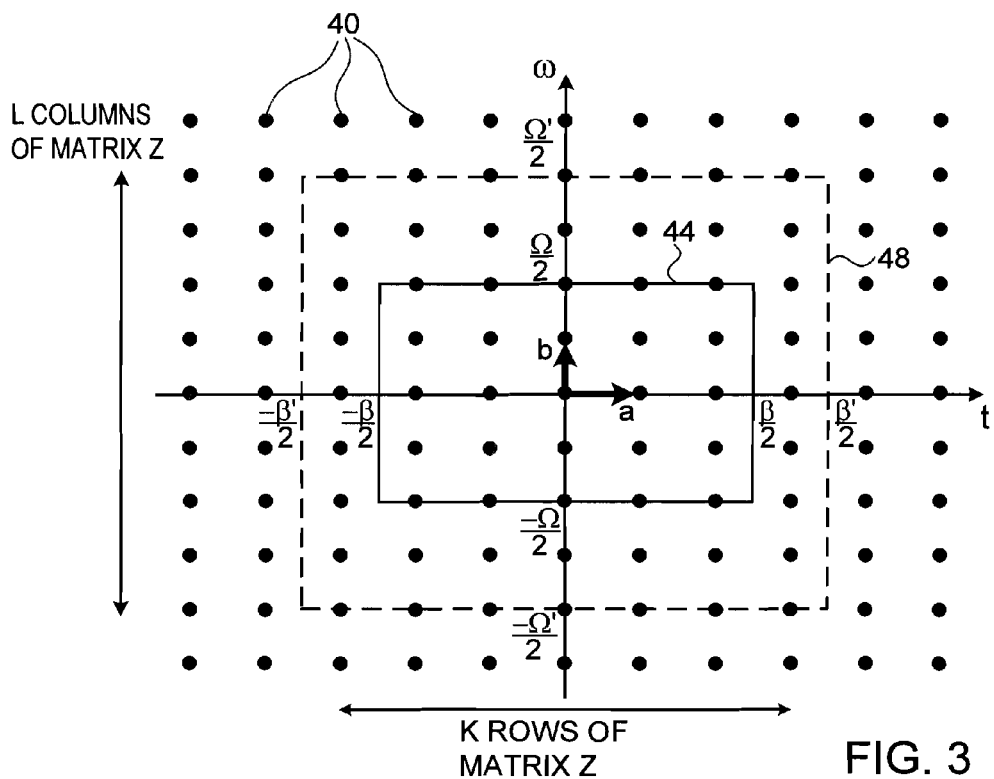
FIG. 3 is a diagram showing time-frequency positions of Gabor coefficients, in accordance with an embodiment of the present invention.

FIG. 3 is a diagram showing time-frequency positions of Gabor coefficients $z_{kl}$ of matrix Z, in accordance with an embodiment of the present invention. Matrix Z can be viewed as a two-dimensional array of Gabor coefficients in time-frequency space. In FIG. 3, each Gabor coefficient is represented by a time-frequency point 40. In the time domain, the Gabor coefficients are computed at a spacing of a from one another, i.e., at times 0, ±a, ±2a . . . . . The spacing a typically depends on the maximum pulse width W, with some over-sampling ratio denoted μ, i.e., α=μ·W. In the frequency domain, the Gabor coefficients are computed at a spacing of b from one another, i.e., at frequencies 0, ±b, ±2b . . . . The spectral resolution is typically selected to be b=1/W.

Coefficients $z_{kl}$, k,l=0, ±1, ±2, ±3 . . . make up an infinite set of Gabor coefficients. As noted above, however, signal f(t) is time-limited to the time interval $[-\beta/2, \beta/2]$ and essentially band-limited to the spectral interval $[-\Omega/2, \Omega/2]$. Under these conditions, it can be shown that the signal can be sampled with little or no loss of information by computing the Gabor coefficients in a time interval $[-\beta'/2, \beta'/2]$, which is somewhat larger and contains interval $[-\beta/2, \beta/2]$. In the frequency domain, it is sufficient to compute the Gabor coefficients in a spectral interval $[-\Omega'/2, \Omega'/2]$, which is somewhat larger and contains interval $[-\Omega/2, \Omega/2]$.

Typically, the window function g(t) is chosen to be well-localized in the frequency domain. In other words, g(t) is typically selected such that its Fourier transform decays rapidly with frequency. When g(t) is selected in this way, spectral interval $[-\Omega'/2, \Omega'/2]$ can be only slightly larger than interval $[-\Omega/2, \Omega/2]$, and the number of samples needed for accurate signal reconstruction can be reduced.

A rectangle 48 in FIG. 3 marks the essential time-frequency support of signal f(t), which is time-limited and essentially band-limited to a rectangle 44 defined by $[-\beta/2, \beta/2] \times [-\Omega/2, \Omega/2]$. Typically, unit 28 computes the Gabor coefficients that fall in rectangle 48 in order to enable reliable reconstruction of the signal. The number of rows in matrix Z (i.e., the number of Gabor coefficients in the time domain) is denoted K. The number of columns in matrix Z (i.e., the number of Gabor coefficients in the frequency domain) is denoted L. It can be shown that the total number of Gabor coefficients in the matrix is given by:

$$K \cdot L \approx \frac{\beta'}{a} \frac{\Omega'}{b} = \beta' \Omega' \mu^{-1} \quad [2]$$

The factor μ in Equation [2] denotes an over-sampling factor for Gabor frames (which can be viewed as over-completed dictionaries for the space of square integrable functions). The over-sampling factor μ quantifies the amount of over-completeness: μ=1 corresponds to an orthogonal basis, and μ<1 corresponds to a frame. In the embodiments described herein μ is typically smaller than unity, in order to find well-localized windowing functions g(t) that form a frame.

The description above refers to sampling unit 28 as computing the individual Gabor coefficients, for the sake of clarity. As noted above, however, in some embodiments unit 28 does not compute the individual Gabor coefficients, but rather linear combinations of the Gabor coefficients, or Gabor coefficients of linear combinations of the signal. Such configurations are described in detail below. It should be noted that the specific sub-Nyquist sampling configurations described herein are shown purely by way of example. The disclosed techniques can be used with any other suitable sampling scheme that produces linear combinations of the Gabor coefficients, or Gabor coefficients of linear combinations of the signal, for example filtering-based methods.

Efficient Gabor-Based Sampling of Sparse Analog Signals

The total number of Gabor coefficients in the above description, K·L, does not take into account the fact that signal f(t) is sparse in time. If sampling unit 28 were to compute all K·L Gabor coefficients, i.e., a matrix Z of K rows and L columns, most of the matrix rows would be all-zero. Computing the complete K·L matrix would involve an unnecessarily high sampling rate and a large number of unnecessary computations.

In some embodiments of the present invention, unit 28 computes a considerably smaller number of Gabor coefficients, by taking advantage of the time sparsity of signal f(t). It can be shown that the number of matrix rows can be reduced using the disclosed techniques to M, which is considerably smaller than K and is given by:

$$M \geq 2 \cdot \lceil 2\mu^{-1} \rceil \cdot N \quad [3]$$

As a result, the sampling rate used for sampling the analog signal f(t) is reduced significantly, far below the Nyquist rate of the signal. When using the disclosed techniques, the signal can be sampled reliably using only $\approx 4\Omega'WN\mu^{-1}$ samples instead of $\Omega'\beta$ samples for conventional Nyquist samples. Assuming $4WN\mu^- < \beta$, the disclosed techniques achieve a sampling rate that is lower than that achievable using conventional sampling techniques. (In the context of the present patent application and in the claims, the term "Nyquist rate," with reference to a signal that is constrained to the finite time interval $[-\beta/2, \beta/2]$ and essentially band-limited to the spectral interval $[-\Omega'/2, \Omega'/2]$, is defined as $\Omega'\beta$. In other words, the Nyquist rate of such a signal depends on the desired reconstruction accuracy, which is in turn related to the essential bandwidth of the signal.)

In some embodiments, signal f(t) is sparse in frequency in addition to being sparse in time. Such signals are common, for example, in radar applications. The dual sparsity can be used to further reduce the sampling rate using the disclosed techniques. Example sampling and reconstruction schemes for such signals are described further below.

Hardware Configurations for Efficient Gabor-Based Sampling

The description that follows presents several hardware configurations for sampling the analog signal f(t) efficiently using the Gabor-based sampling scheme described above. These hardware configurations exploit the sparsity of f(t) in the time domain to reduce both sampling rate and hardware complexity.

Figure 4:
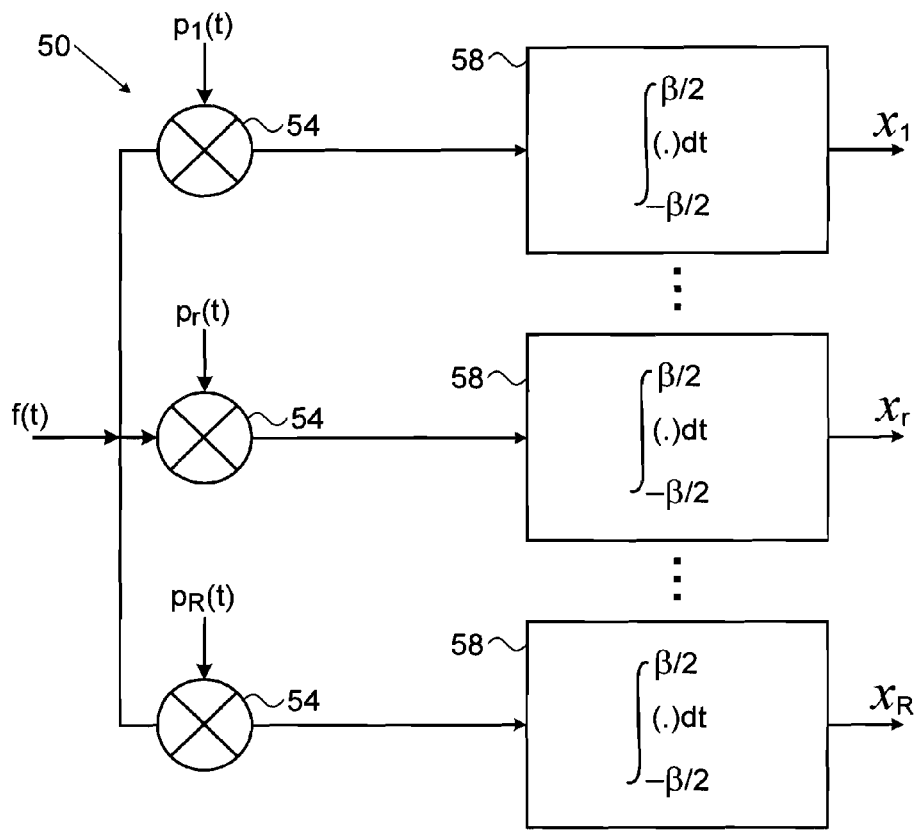
FIG. 4 is a block diagram that schematically illustrates a signal sampling unit, in accordance with an embodiment of the present invention.

FIG. 4 is a block diagram that schematically illustrates a signal sampling unit 50, in accordance with an embodiment of the present invention. The configuration of unit 50 can be used, for example, to implement sampling unit 28 of FIG. 1 above.

Unit 50 distributes the incoming analog signal f(t) to multiple sampling channels operating in parallel. The number of sampling channels is denoted R. The $r^{th}$ sampling channel, $1 \leq r \leq R$, comprises a respective mixer 54, which mixes f(t) with a respective modulating waveform denoted $p_r(t)$. An integrator 58 integrates the mixer output over the time interval $[-\beta/2, \beta/2]$. The modulating waveforms $p_r(t)$ are given by:

$$p_r(t) = e^{-2\pi i b l t} \sum_{k=-K_0}^{K_0} c_{mk} \overline{g(t-ak)} \quad [4]$$

wherein $c_{mk}$ are weight coefficients and $\overline{g(t-ak)}$ denotes the complex conjugate of $g(t-ak)$. Index $r=(m,l)$ is a double index with $l=-L_0 \ldots L_0$ and $m=0 \ldots (M-1)$. $K_0$ and $L_0$ are given by:

$$K_0 = \left\lceil \frac{\beta+W}{2W\mu} \right\rceil - 1 \quad L_0 = \left\lceil \frac{(\Omega+B)W}{2} \right\rceil - 1 \quad [5]$$

wherein B denotes the essential bandwidth of windowing function g(t).

Modulating waveforms $p_r(t)$ are different from one another. Each modulating waveform is designed such that the mixing operation produces a different weighted superposition of multiple sub-sections of f(t) from multiple sub-intervals of interval $[-\beta/2, \beta/2]$. Each sub-section of the signal is windowed (multiplied) by the windowing function g(t). In a given modulating waveform, the multiple windowed sub-sections of the signal are weighted with the weight coefficients $c_{mk}$ and then summed.

Figure 5A:
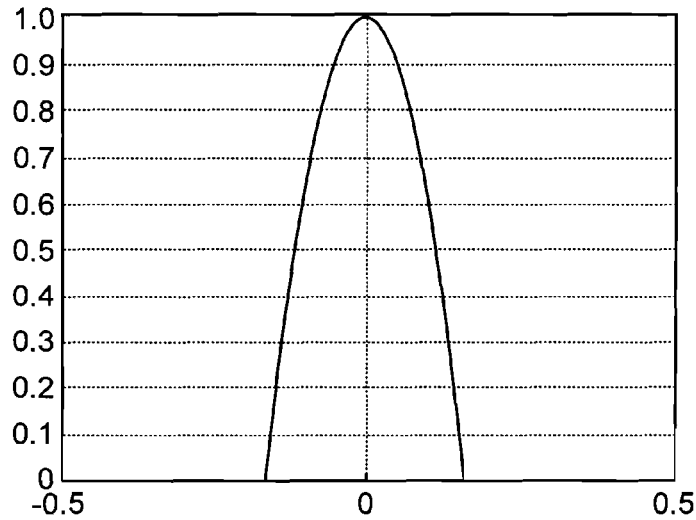
FIGS. 5A-5C are graphs showing waveforms used in the signal sampling unit of FIG. 4, in accordance with an embodiment of the present invention.
Figure 5B:
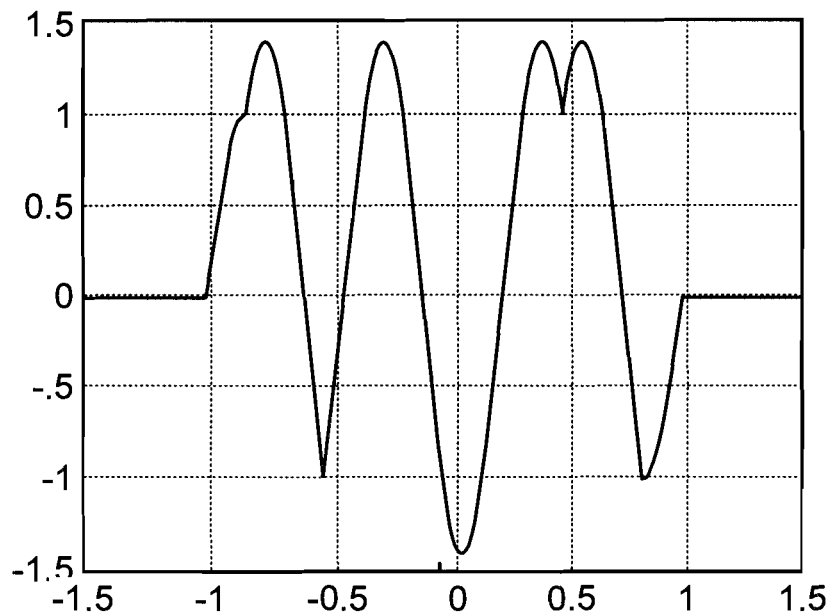
Figure 5C:
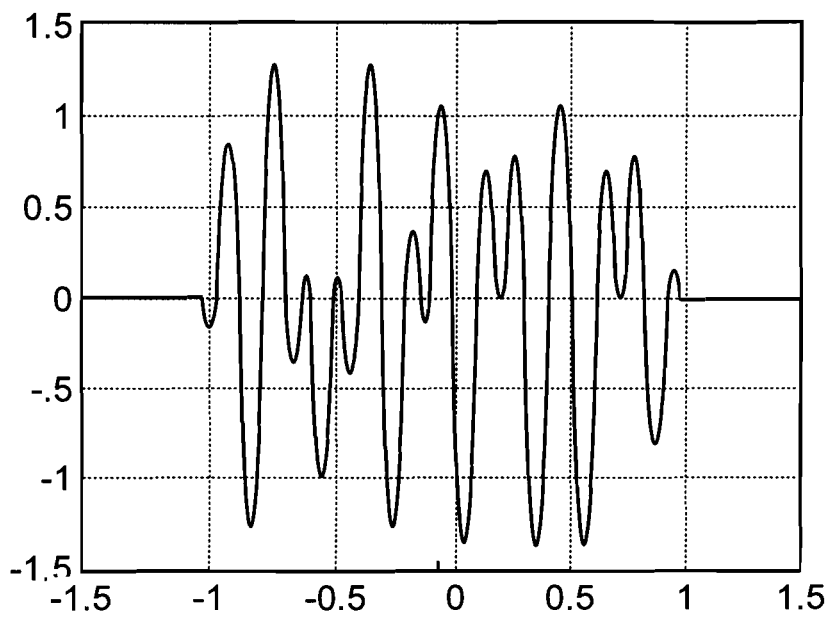

FIGS. 5A-5C are graphs showing waveforms used in the signal sampling unit of FIG. 4, in accordance with an embodiment of the present invention. FIG. 5A shows an example windowing function g(t), in the present example a cosine function having a width 0.3S and a shift parameter of a=0.15S. FIG. 5B shows an example weighted sum of shifted replicas of the windowing function of FIG. 5A. In the present example, the weighting coefficients $c_{mk}$ have values of ±1 and $IC_0=5$. FIG. 5C shows the real component of a modulating waveform $p_r(t)$, which is produced by modulating the weighted sum of FIG. 5B by $e^{2\pi i b l t}$. The waveforms shown in FIGS. 5A-5C are example waveforms, which are chosen for the sake of conceptual clarity. In alternative embodiments, any other suitable waveforms can also be used.

The R integrators 58 in FIG. 4 above produce R respective output values denoted $x_r$, $1 \leq r \leq R$. These R values are the samples of signal f(t), which enable high-quality reconstruction of the signal. It can be shown that the output values $x_r$ can be expressed in terms of the Gabor coefficients $z_{kl}$ described above:

$$x_r = \int_{-\beta/2}^{\beta/2} f(t) p_r(t) dt = \sum_{k=-K_0}^{K_0} c_{mk} z_{kl} \quad [6]$$

wherein $c_{mk}$ are the weighting coefficients of modulating waveform $p_r(t)$, as defined in Equation [4] above. In matrix form, this relation can be written as:

$$X = C \cdot Z \quad [7]$$

wherein X denotes a matrix containing output values $x_r$, C denotes a matrix containing weight coefficients $c_{mk}$, and Z denotes the matrix of Gabor coefficients $z_{kl}$ defined above. In some embodiments, matrix Z is sparse, i.e., has only a small number on non-zero rows.

In some embodiments, processing unit 32 reconstructs the signal f(t) based on these output values. The reconstruction process may be performed using any suitable Compressed Sensing (CS) process, and is considered to be outside the scope of the present disclosure. Some aspects of signal reconstruction, and citations of several CS methods that can be used for this purpose, are given further below.

In order to enable signal reconstruction, weight coefficients $c_{mk}$ should be selected such that matrix C qualifies as a CS matrix. To qualify as a CS matrix, matrix C may have low coherence or low restricted isometry constants. In some embodiments, this requirement is fulfilled by assigning weight coefficients $c_{mk}$ pseudo-random ±1 values. Alternatively, weight coefficients $c_{mk}$ may be assigned any other suitable values that enable reconstruction of matrix Z from matrix X.

In some embodiments, a multi-channel sampling unit can be implemented using filters instead of integrators. In comparison with the scheme of FIG. 4, for example, integrators 58 can be replaced with respective filters s(t). The response of the filters is given by:

$$s(t) = \sum_{m=0}^{M-1} s_m(t + WKm), \quad [7]$$

$$s_m(t) = \sum_{k=-K_0}^{K_0} c_{mk} \overline{g(t-ak)}$$

Under these assumptions, the output value produced by the $l^{th}$ sampling channel is given by:

$$x_m[l] = (e^{-2\pi iblt} f(t) * s(-t))[WKm] = \ldots = \sum_{k=-K_0}^{K_0} c_{mk} z_{kl} \quad [8]$$

wherein the * operator denotes convolution. When using this filter-based sampling configuration, the number of sampling channels can be reduced from M·L to L.

Figure 6:
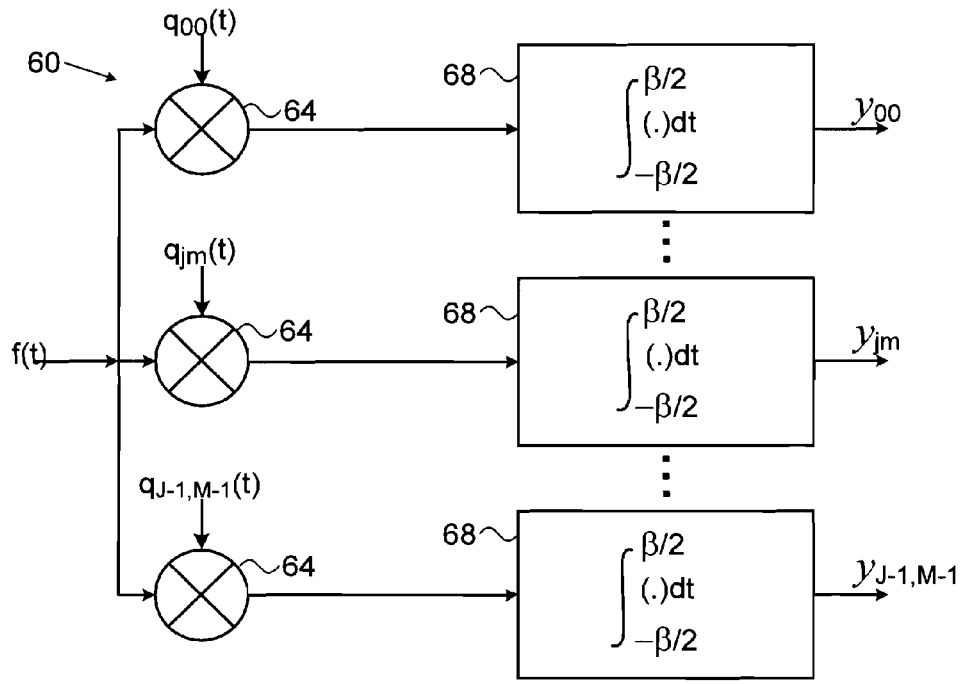
FIG. 6 is a block diagram that schematically illustrates a signal sampling unit, in accordance with an alternative embodiment of the present invention.

FIG. 6 is a block diagram that schematically illustrates a signal sampling unit 60, in accordance with an alternative embodiment of the present invention. The configuration of unit 50 can be used, for example, to implement sampling unit 28 of FIG. 1 above. In comparison with sampling unit 50 of FIG. 4 above, the configuration of sampling unit 60 uses modulating waveforms that are sometimes simpler to implement in hardware.

Unit 60 distributes the analog signal f(t) to multiple sampling channels operating in parallel. The number of sampling channels is J·M, wherein J≥L. The sampling channels are indexed with a double index denoted jm, such that j=0 . . . (J−1) and m=0 . . . (M−1). The $jm^{th}$ sampling channel comprises a respective mixer 64, which mixes f(t) with a respective modulating waveform denoted $q_{jm}(t)$. An integrator 68 integrates the mixer output over the time interval [−β/2,β/2]. The modulating waveforms $q_{jm}(t)$ are given by:

$$q_{jm}(t) = \sum_{l=-L_0}^{L_0} d_{jl} p_{ml}(t) = \sum_{l=-L_0}^{L_0} d_{jl} e^{-2\pi iblt} \sum_{k=-K_0}^{K_0} c_{mk} \overline{g(t-ak)} \quad [9]$$

The terms $$\sum_{l=-L_0}^{L_0} d_{jl} e^{-2\pi iblt} \text{ and } \sum_{k=-K_0}^{K_0} c_{mk} \overline{g(t-ak)}$$

in Equation [9] are denoted with $w_j(t)$ and $s_m(t)$, respectively. As noted above, coefficients $c_{mk}$ in $s_m(t)$ are typically chosen so that matrix C is a valid CS matrix. The coefficients $d_{jl}$ in $w_j(t)$ are typically chosen so that they form an invertible matrix.

The scheme of FIG. 6 is mathematically equivalent to the scheme of FIG. 4 above. In some embodiments, integrators 68 may be replaced with filters s(t) as explained above. Modulating waveforms $q_{jm}(t)$ of FIG. 6 are sometimes simpler to implement in hardware than modulating waveforms $p_r(t)$ of FIG. 4. As can be seen in Equation [4] above, waveforms $p_r(t)$ are modulated pulse sequences multiplied by sinusoidal signals of the form $e^{2\pi iblt}$. The frequencies of these sinusoidal signals are multiples of some common base frequency. Generation of a large number of such sinusoidal signals may be complicated. Generating the $$w_j(t) = \sum_{l=-L_0}^{L_0} d_{jl} e^{-2\pi iblt}$$

term in Equation [9] above, i.e., a weighted sum of sinusoids, is sometimes more straightforward. This is due to the fact that the weighted sum represents a low-pass periodic function, so that in practice only one time signal is typically needed.

For any given value of m, let $P_m$ denote a set of L modulating waveforms $p_r(t)$ whose index is r=(m,l) with |l|≤$L_0$. The notations $p_{ml}(t)$ and $p_r(t)$ are used interchangeably. As can be seen in Equation [9], each modulating waveform $q_{jm}(t)$ is a weighted sum of waveforms $p_r(t) \in P_m$. The waveforms $p_r(t)$ in each set $P_m$ are mixed in the same manner, since $d_{jl}$ does not depend on m. Sampling unit 60 produces J·M output values denoted $y_{jm}$. The output value produced by the $jm^{th}$ sampling channel is given by:

$$y_{jm}(t) = \sum_{l=-L_0}^{L_0} d_{jl} x_m(l), \; x_m[l] = x_r \quad [10]$$

Equation [10] can be written in matrix form as:

$$Y = D \cdot X^T \quad [11]$$

wherein Y denotes a matrix containing output values $y_{jm}$, D denotes a matrix containing coefficients $d_{jl}$, and $X^T$ denotes the transpose of matrix X Coefficients $d_{jl}$ are typically selected such that matrix D is invertible.

An example scheme for generating $w_j(t)$ such that D is invertible is described in the paper by Gedalyahu, Tur and Eldar, cited above. In this scheme, waveforms $w_j(t)$ are obtained from functions $$\tilde{w}_j(t) = \sum_{l \in \mathbb{Z}} \sum_{i=0}^{I-1} \alpha_j[i] w\left(t - \frac{i}{bI} - \frac{l}{b}\right) \quad [12]$$

wherein w(t) is a certain pulse shape, $\alpha_j[i]$ is a sequence of length I. Waveforms $w_j(t)$ are derived from the respective functions $\tilde{w}_j(t)$ by filtering them with a filter u(t). Since $\tilde{w}_j(t)$ is periodic with period 1/b, it can be expressed as:

$$\tilde{w}_j(t) = \sum_{l \in \mathbb{Z}} \tilde{d}_{jl} e^{-2\pi iblt} \quad [13]$$

After filtering with u(t), the coefficients become $d_{jl} = \tilde{d}_{jl} \cdot \hat{u}(bl)$. The matrix D is left invertible if the following four conditions are met:

J≥I≥L;
The frequency response of filter u(t) satisfies $$\hat{u}(w) = \begin{cases} \text{nonzero} & w = bl, |l| \leq L_0 \\ 0 & w = bl, |l| \geq L_0 \\ \text{arbitrary} & \text{elsewhere} \end{cases}$$

The frequency response of w(t) satisfies $\hat{w}(bl) \neq 0$ for |l|≤$L_0$;
The sequences $\alpha_j[i]$ are chosen such that the matrix A, whose $ji^{th}$ element is $\alpha_j[i]$, has full column rank.

In an example embodiment that satisfies the four conditions defined above, J=I=L, $$w(t) = \begin{cases} 1 & t \in [0, 1/bI] \\ 0 & t \notin [0, 1/bI] \end{cases},$$

and $\alpha_j[i]$ is a sequence of ±1 values that are created using cyclic shifts of a certain base sequence in a way that A is invertible. Such rectangular pulses with alternating signs can be generated using suitable hardware in a straightforward manner. See, for example, the paper by Mishali et al., entitled "Xampling: Analog to Digital at Sub-Nyquist Rates," cited above. In this example, the shaping filter frequency response $\hat{u}(\omega)$ is designed to transfer only the Fourier coefficients whose indices are $|l| \leq L_0$ and suppress the other coefficients. Alternatively, any other suitable scheme can be used.

Figure 7A:
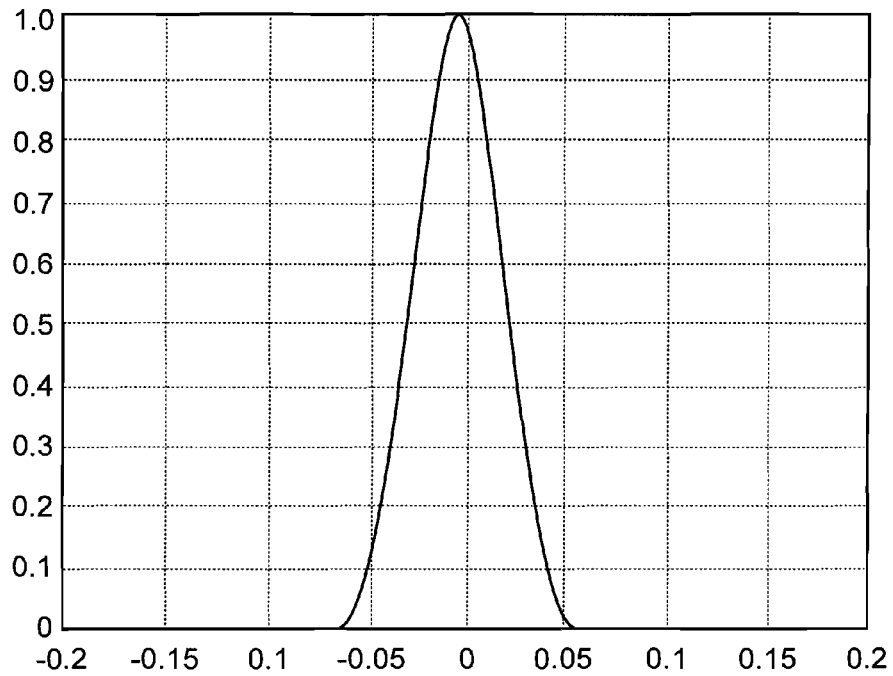
FIGS. 7A-7C are graphs showing waveforms used in the signal sampling unit of FIG. 6, in accordance with an embodiment of the present invention.
Figure 7B:
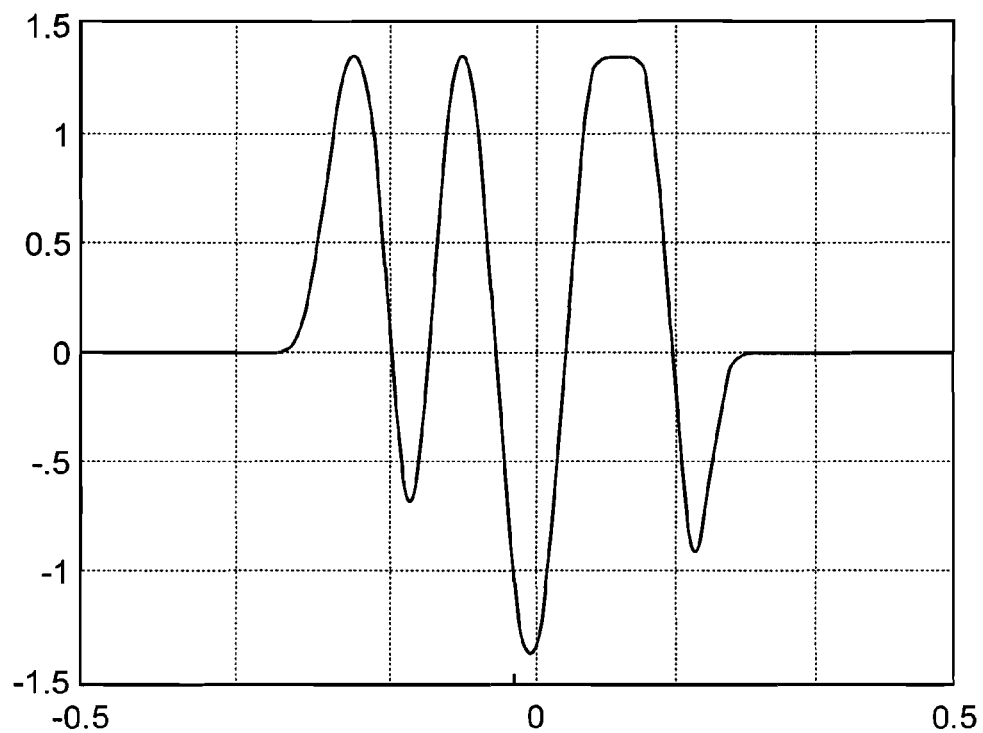
Figure 7C:
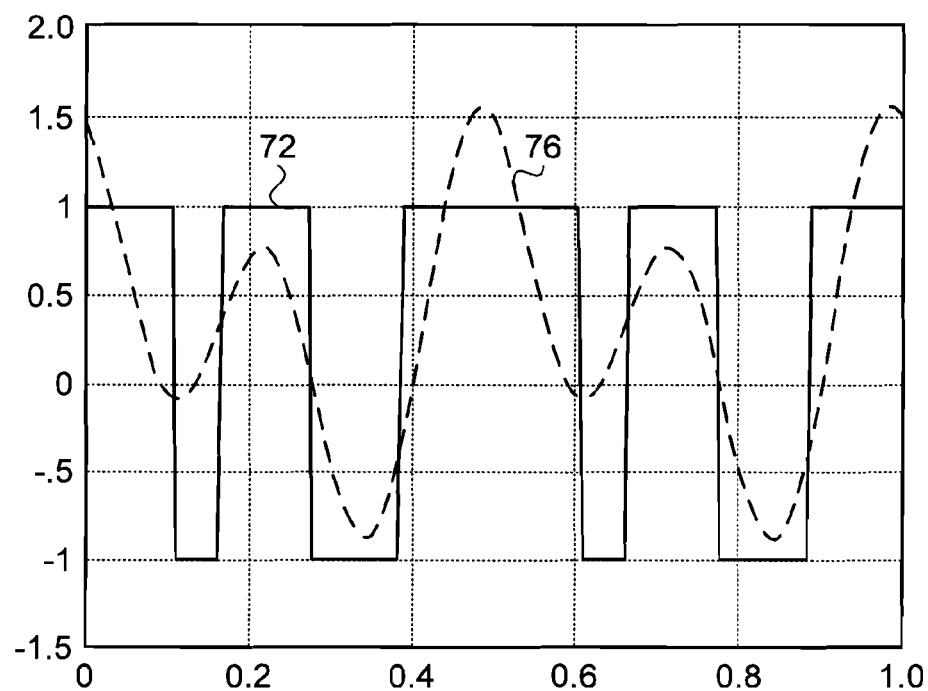

FIGS. 7A-7C are graphs showing waveforms used in signal sampling unit 60 of FIG. 6, in accordance with an embodiment of the present invention. FIG. 7A shows an example windowing function g(t), in the present example a B-spline of order three. FIG. 7B shows an example waveform $s_m(t)$, which is generated using the windowing function of FIG. 7A. In the present example, the over-sampling parameter is set to $\mu=\frac{1}{3}$, and $K_0=5$. In FIG. 7C, a graph 72 shows an example waveform $\tilde{w}_j(t)$, before filtering with u(t). A graph 76 shows an example waveform $w_j(t)$, after filtering with u(t). (Generally, any of the system configurations of FIGS. 4 and 6 may use any of the waveforms shown in FIGS. 5A-5C and FIGS. 7A-7C.)

In some embodiments, processing unit 32 of system 20 (FIG. 1) reconstructs the analog signal f(t) from the output coefficients $y_{jm}$ produced by sampling unit 60 of FIG. 6, i.e., from matrix Y of Equation [11]. Equation [11] can be written as:

$$Y = D \cdot X^T = D \cdot Z^T \cdot C^T \quad [14]$$

Assuming matrix D has a full column rank, where J≥L is a necessary condition, unit 32 can recover matrix X from matrix Y by evaluating:

$$X = (D^\dagger Y)^T \quad [15]$$

wherein † denotes the pseudo-inverse operator. Then, unit 32 can recover the matrix Z of Gabor coefficients from matrix X using the relation X=C·Z. Assuming that matrix Z is sparse, derivation of Z from X can be carried out using any suitable Compressed Sensing (CS) method. Example CS schemes that can be used for this purpose are described by Eldar and Mishali, in "Robust Recovery of Signals from a Structured Union of Subspaces," IEEE Transactions on Information Theory, volume 55, no. 11, 2009, which is incorporated herein by reference. Alternatively, any other suitable CS scheme can also be used. As noted above, the specific CS reconstruction scheme used by unit 32 is considered outside the scope of the present disclosure.

Figure 8:
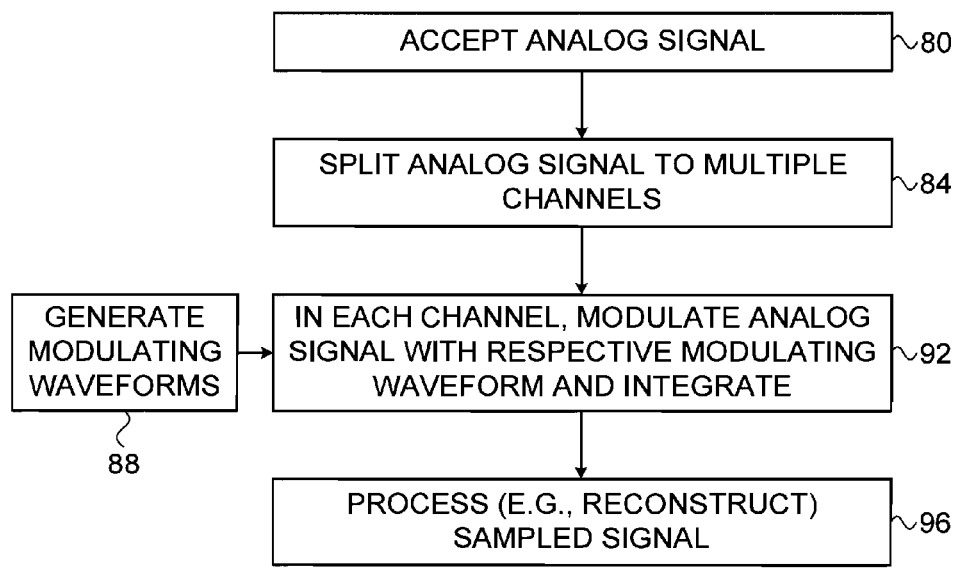
FIG. 8 is a flow chart that schematically illustrates a method for signal sampling and processing, in accordance with an embodiment of the present invention.

FIG. 8 is a flow chart that schematically illustrates a method for signal sampling and processing, in accordance with an embodiment of the present invention. The method begins with input interface 24 of system 20 accepting an analog signal f(t), at an input step 80. Sampling unit 28 of system 20 (e.g., unit 50 of FIG. 4 or unit 60 of FIG. 6) distributes the analog signal to multiple parallel sampling channels, at a signal splitting step 84. Sampling unit 28 also generates the modulating waveforms (e.g., $p_r(t)$ in the configuration of FIG. 4, or $q_{jm}(t)$ in the configuration of FIG. 6), at a waveform generation step 88.

In each sampling channel, unit 28 modulates (mixes) the analog signal with the respective modulating waveform of that channel, and then integrates the modulated signal, at a modulation and integration step 92. The resulting output values ($x_r$ in the configuration of FIG. 4, or $y_{jm}$ in the configuration of FIG. 6) represents the analog signal with high accuracy, while requiring a sub-Nyquist sampling rate. Processing unit 32 of system 20 processes the sampled signal, at a processing step 96. In some embodiments, unit 32 reconstructs the analog signal as explained above. In alternative embodiments, unit 32 may apply any other suitable processing to the sampled signal, such as detecting the occurrence of a pulse and/or determining the time positions of the pulses in the time interval.

The system elements described herein, including input interface 24, sampling units 32, 50 and 60 and processing unit 32, can be implemented in hardware, such as using one or more discrete components, Application-Specific Integrated Circuits (ASICS) or Field-Programmable Gate arrays (FPGAs). Alternatively, some system elements may be implemented in software executing on a suitable processor, or using a combination of hardware and software elements. When some or all system elements are implemented in software, the processor may comprise a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory. The system configurations shown in FIGS. 1, 4 and 6 are example configurations, which are chosen for the sake of conceptual clarity. In alternative embodiments, any other suitable system configuration can also be used.

Sampling Signals Irrespective of Sparsity

Some of the sampling schemes described herein, such as the schemes of FIGS. 4 and 6 above, can be used for sampling analog signals without attempting to exploit any time sparsity of the signal. Such sampling schemes are useful, for example, for sampling signals that have no multi-pulse structure, non-sparse signals in general, or signal for which no information regarding sparsity is available.

In some embodiments, sampling unit 28 is designed to sample analog signals without assuming or exploiting time sparsity, using the scheme of FIG. 4 (multi-channel scheme with modulating waveforms $p_r(t)$) or the scheme of FIG. 6. (multi-channel scheme with modulating waveforms $q_{jm}(t)$). In these embodiments, the number of channels (modulation waveforms) should be at least M=K, since the signal is not assumed to be sparse.

Matrix C in these embodiments is a square matrix of size K·K, which should be invertible. In an example embodiment, matrix C comprises a Vandermonde matrix. Thus, waveforms $p_r(t)$ are generated using different circulant shifts of a certain sequence of coefficients c.

In alternative embodiments, analog signals can be sampled irrespective of sparsity using a sampling unit that is based on filtering instead of integration, as explained above.

Sampling and Reconstruction of Signals that are Sparse in Both Time and Frequency In some embodiments, signal f(t) is sparse in the frequency domain in addition to its sparsity in the time domain. For signals of this sort (e.g., signals that are both multi-pulse and essentially multi-band), matrix Z is sparse in columns in addition to its sparsity in rows. In other words, when signal f(t) is sparse in both time and frequency, matrix Z has only a small number of non-zero rows and a small number of dominant columns. The non-dominant columns contain matrix elements that are very small in comparison with the dominant columns.

The sparsity of matrix Z in both rows and columns can be used to further reduce the sampling rate of such signals. The dominant columns of matrix Z typically correspond to the spectral locations of the essential bands of the signal. In some embodiments, the sampling unit may sample such a signal by applying the sampling scheme with modulating waveforms $q_{jm}(t)$ (FIG. 6) with a total number of J·M waveforms, wherein J in these embodiments is smaller than L due to the frequency sparsity.

In these embodiments, the signal can be reconstructed by solving Z from the relation $Y=DX^T=DZ^TC^T$ using the following sequence of computations:

Transform the relation to $Y^T=CW$, wherein $W=ZD^T$ and W has only a small number of non-zero rows.

Apply any suitable CS method to solve for the sparse matrix W from $Y^T=CW$.

Once W is found, solve for Z using any suitable CS method from $W^T=DZ^T$. Note, however, that the solution (denoted V) will typically not be exactly Z, since $Z^T$ is not exactly sparse in rows but rather approximately sparse. Nevertheless, the $L^2$ error of Z-V is typically small, and the reconstruction is therefore accurate.

A radar signal is one example of an analog signal that is sparse in both time and frequency. Consider a radar signal of the form $$r(t) = \sum_{n=1}^{N} e^{2\pi i \omega_n t} h(t - x_n),$$

wherein $x_n$ denote shifts in time, $\omega_n$ denote shifts in frequency, and h(t) is a compactly supported pulse that is well concentrated in frequency.

When computing Gabor coefficients for such a signal with a windowing function g(t) that is compactly supported in time and well concentrated in frequency, for each non-zero row there are at least U dominant entries (U is related to the essential bandwidth of the pulse h(t), function g(t) and lattice constant b). In an embodiment, U is given by $U=2U_0+1$, wherein $U_0=\lceil(\Omega_h+B)W/2\rceil-1$. $\Omega_h$ and B denote the essential bandwidths of the pulses h(t) and the window g(t), respectively. Assuming there are no more than S≤N different possible values of $\omega_n$, then matrix Z has U·S dominant columns and $[2\mu^{-1}]N$ non-zero rows. Matrix Z can be solved for using the above-described method. The number of waveforms needed for recovering Z is $2US \cdot 2[2\mu^{-1}]N=4 \cdot US \cdot [2\mu^{-1}]N$.

Although the embodiments described herein mainly address exploitation of sparsity in the Gabor domain, the methods and systems described herein can also be used, mutatis mutandis, to exploit sparsity in other domains or transforms, such as wavelet transforms. In the latter example, the disclosed techniques can be used to sample signals that are sparse in time and smooth, and therefore sparse in the wavelet domain.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for signal processing, comprising:
accepting an analog signal, which consists of a sequence of pulses confined to a finite time interval;
sampling the analog signal at a sampling rate that is lower than a Nyquist rate of the analog signal and with samples taken at sample times that are independent of respective pulse shapes of the pulses and respective time positions of the pulses in the time interval, by computing sampled values based on Gabor coefficients with respect to a predefined windowing function; and
processing the sampled analog signal.

2. The method according to claim 1, wherein the sampled values comprise one of:
Gabor coefficients of the analog signal;
linear combinations of the Gabor coefficients of the analog signal; and
Gabor coefficients of linear combinations of the analog signal.

3. The method according to claim 1, wherein the analog signal is sparse in time.

4. The method according to claim 1, wherein processing the sampled analog signal comprises reconstructing the analog signal based on the sampled analog signal.

5. The method according to claim 1, wherein the analog signal originates from one of an ultrasound signal, a radar signal, a communication signal, a bio-imaging signal and a neuronal signal.

6. A method for signal processing, comprising:
accepting an analog signal, which consists of a sequence of pulses confined to a finite time interval;
sampling the analog signal at a sampling rate that is lower than a Nyquist rate of the analog signal and with samples taken at sample times that are independent of respective pulse shapes of the pulses and respective time positions of the pulses in the time interval, by generating a plurality of weighted superpositions of multiple sub-sections of the analog signal that are drawn from respective sub-intervals of the finite time interval and windowed by a predefined windowing function, and sampling the analog signal using the weighted superpositions; and
processing the sampled analog signal.

7. The method according to claim 6, wherein sampling the analog signal comprises integrating each weighted superposition over the finite time interval to produce a respective sampled value.

8. The method according to claim 6, wherein sampling the analog signal comprises filtering each weighted superposition to produce a respective sampled value.

9. A method for signal processing, comprising:
accepting an analog signal, which consists of a sequence of pulses confined to a finite time interval;
sampling the analog signal at a sampling rate that is lower than a Nyquist rate of the analog signal and with samples taken at sample times that are independent of respective pulse shapes of the pulses and respective time positions of the pulses in the time interval, by modulating multiple replicas of the analog signal with respective different modulating waveforms, which depend on a predefined windowing function; and
processing the sampled analog signal.

10. The method according to claim 9, wherein each modulating waveform comprises a respective sinusoidal signal multiplied by a respective weighted sum of time shifts of the windowing function.

11. The method according to claim 9, wherein each modulating waveform comprises a respective first weighted sum of sinusoidal signals, multiplied by a respective second weighted sum of time shifts of the windowing function.

12. A method for signal processing, comprising:

accepting an analog signal, which consists of a sequence of pulses confined to a finite time interval and which is sparse in both time and frequency;

sampling the analog signal at a sampling rate that is lower than a Nyquist rate of the analog signal and with samples taken at sample times that are independent of respective pulse shapes of the pulses and respective time positions of the pulses in the time interval, by setting the sampling rate responsively to time and frequency sparsity of the signal; and processing the sampled analog signal.

13. A signal processing apparatus, comprising:

an input interface, which is configured to accept an analog signal consisting of a sequence of pulses confined to a finite time interval; and a sampling unit, which is configured to sample the analog signal at a sampling rate that is lower than a Nyquist rate of the analog signal and with samples taken at sample times that are independent of respective pulse shapes of the pulses and respective time positions of the pulses in the time interval, by computing sampled values based on Gabor coefficients with respect to a predefined windowing function.

14. A signal processing apparatus, comprising:

an input interface, which is configured to accept an analog signal consisting of a sequence of pulses confined to a finite time interval; and a sampling unit, which is configured to sample the analog signal at a sampling rate that is lower than a Nyquist rate of the analog signal and with samples taken at sample times that are independent of respective pulse shapes of the pulses and respective time positions of the pulses in the time interval, by generating a plurality of weighted superpositions of multiple sub-sections of the analog signal that are drawn from respective sub-intervals of the finite time interval and windowed by a predefined windowing function, and sampling the analog signal using the weighted superpositions.

15. A method for signal processing, comprising:

accepting an analog signal that is confined to a finite time interval;

sampling the analog signal by generating multiple sampled values, each sampled value comprising a respective linear combination of Gabor coefficients of the analog signal with respect to a predefined windowing function, wherein generating the sampled values comprises generating a plurality of weighted superpositions of multiple sub-sections of the analog signal that are drawn from respective sub-intervals of the finite time interval and windowed by the predefined windowing function, and sampling the analog signal using the weighted superpositions; and processing the sampled values.

16. The method according to claim 15, wherein generating the sampled values comprises integrating each weighted superposition over the finite time interval to produce a respective sampled value.

17. The method according to claim 15, wherein generating the sampled values comprises filtering each weighted superposition to produce a respective sampled value.

\* \* \* \* \*